(12) United States Patent
Yamasaki et al.

(10) Patent No.: US 8,592,824 B2
(45) Date of Patent: Nov. 26, 2013

(54) HIGH EFFICIENCY INDIRECT TRANSITION SEMICONDUCTOR ULTRAVIOLET LIGHT EMITTING DEVICE

(75) Inventors: Satoshi Yamasaki, Ibaraki (JP); Toshiharu Makino, Ibaraki (JP); Hideyo Ookushi, Ibaraki (JP); Norio Tokuda, Ibaraki (JP); Hiromitsu Kato, Ibaraki (JP); Masahiko Ogura, Ibaraki (JP); Hideyuki Watanabe, Ibaraki (JP); Sung-Gi Ri, Ibaraki (JP); Daisuke Takeuchi, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 720 days.

(21) Appl. No.: 12/438,396

(22) PCT Filed: Aug. 13, 2007

(86) PCT No.: PCT/JP2007/065811
§ 371 (c)(1), (2), (4) Date: Mar. 18, 2009

(87) PCT Pub. No.: WO2008/023592
PCT Pub. Date: Feb. 28, 2008

(65) Prior Publication Data
US 2010/0001292 A1    Jan. 7, 2010

(30) Foreign Application Priority Data

Aug. 25, 2006 (JP) ................................ 2006-228583
Apr. 25, 2007 (JP) ................................ 2007-114981

(51) Int. Cl.
*H01L 29/15* (2006.01)
(52) U.S. Cl.
USPC .. 257/77; 257/86; 257/E23.111; 257/E21.005

(58) Field of Classification Search
USPC .................. 257/E23.111, E21.005, E21.041, 257/E21.095, E21.096, E21.107, E21.182, 257/E21.27, E21.323, E21.603, E21.604, 257/77–103
See application file for complete search history.

(56) References Cited

U.S. PATENT DOCUMENTS

| | | | | |
|---|---|---|---|---|
| 5,210,431 A | * | 5/1993 | Kimoto et al. | 257/77 |
| 5,284,525 A | * | 2/1994 | Saito et al. | 136/256 |
| 5,523,588 A | * | 6/1996 | Nishimura et al. | 257/77 |
| 5,751,752 A | * | 5/1998 | Shakuda | 372/45.01 |
| 6,204,522 B1 | * | 3/2001 | Bernhoff et al. | 257/77 |
| 6,461,889 B1 | * | 10/2002 | Samoto | 438/105 |
| 6,727,171 B2 | * | 4/2004 | Takeuchi et al. | 438/624 |

(Continued)

FOREIGN PATENT DOCUMENTS

| | | | | |
|---|---|---|---|---|
| JP | 03122093 A | * | 5/1991 | ............. C30B 29/04 |
| JP | 2005-140550 A | | 6/1993 | |
| JP | 2000-277798 A | | 10/2000 | |
| JP | 2002-231996 A | | 8/2002 | |
| JP | 2003-152221 A | | 5/2003 | |
| JP | 2004-207272 A | | 7/2004 | |
| JP | 2005-116794 A | | 4/2005 | |
| JP | 2005-229079 A | | 8/2005 | |
| JP | 2006-222391 A | | 8/2006 | |
| WO | WO 2004/112157 A1 | * | 12/2004 | |

*Primary Examiner* — Cuong Q Nguyen
*Assistant Examiner* — Yosef Gebreyesus
(74) *Attorney, Agent, or Firm* — Howson & Howson LLP

(57) ABSTRACT

Provided is a light emitting device formed of an indirect transition semiconductor configured from a semiconductor material having high exciton binding energy, wherein an active layer of the indirect transition semiconductor or an active region by a pn junction is formed, the light emitting device has an electrode for injecting current into the active layer or the active region, and the internal quantum efficiency is 10% or more.

19 Claims, 6 Drawing Sheets

(56) References Cited

U.S. PATENT DOCUMENTS

| | | |
|---|---|---|
| 6,815,721 B2 | 11/2004 | Okushi et al. |
| 2001/0025955 A1* | 10/2001 | Okushi et al. ................. 257/21 |
| 2004/0155573 A1* | 8/2004 | Horiuchi et al. ............. 313/499 |
| 2004/0206961 A1* | 10/2004 | Yamada et al. ................. 257/79 |
| 2006/0081873 A1* | 4/2006 | Osinsky et al. ............... 257/183 |
| 2007/0272929 A1* | 11/2007 | Namba et al. .................. 257/77 |

* cited by examiner

HIGH EFFICIENCY INDIRECT TRANSITION SEMICONDUCTOR ULTRAVIOLET LIGHT EMITTING DEVICE

TECHNICAL FIELD

The present invention relates to an indirect transition semiconductor light emitting device that emits ultraviolet light with high efficiency.

BACKGROUND ART

Widespread application of a semiconductor ultraviolet source with a wavelength of 350 nm or less can be applied in white lighting, sterilization and water purification, high density optical recording light source, various information sensing systems for fluorescence analysis and the like, medical sector, and so on. Thus, development for realizing the short wavelength and high efficiency of semiconductor light emitting devices is being conducted. In recent years, with a light emitting device using a GaN semiconductor material, luminous efficiency at tens of percent has been obtained with an InGaN system in a luminous region where the wavelength is 400 nm or more. Although an AlGaN system is used in a luminous region with a wavelength that is shorter than 400 nm, the luminous efficiency deteriorates drastically in a luminous region with a wavelength that is shorter than 350 nm, and currently external quantum efficiency can be obtained at only several percent. The primary reasons for this are described below.
1) P-type doping of AlGaN system is difficult. Thus, the formation of a pn junction or a pin junction that is essential in forming the light emitting device becomes difficult.
2) Since there is a difference in the crystal lattice constant in the GaN system and the AlN system, with the AlGaN system that is a mixed crystal system of the foregoing systems, deterioration in the crystallinity such as structural defects and penetrative dislocations in the luminescent layer becomes significant.

Meanwhile, a diamond has a broad band gap of 5.47 eV at room temperature, and even under a high temperature higher than the room temperature, it is able to emit deep ultraviolet light with a wavelength of 235 nm by free excitons. Moreover, high carrier mobility has been attained in recent years not only of p-type doping that was considered difficult in the foregoing AlGaN, but also of n-type doping that was considered difficult with diamonds. And even a pn junction with favorable electrical properties in which the rectification ratio is 6 digits or greater has been previously manufactured (S. Koizumi, et. al.: Science 292, 1899 (2001), T. Makino, et. al., Jpn. J. Appl. Phys. 44, L1190 (2005)).

Moreover, since a diamond is configured from a single element, it does not encounter any problems such as structural defects which are unique to the foregoing AlGaN compound semiconductor. In addition, a diamond possesses superior semiconductor characteristics and optical characteristics in addition to favorable mechanical, chemical and thermal properties (with highest thermal conductivity among semiconductor materials). As described above, a deep ultraviolet light emitting device that uses diamond excitons has many advantages over the AlGaN system.

Meanwhile, most of the highly-efficient light emitting devices which have been put into practical use to date are configured from a direct transition semiconductor. The principle of emission with a direct transition semiconductor is the direct recombination of free electron hole pairs with the same symmetrical point ($\Gamma$ point) of the crystals, which makes the recombination time shorter at an ns order or less. Thus, it is highly likely that the free electron hole pairs will be subject to direct recombination before being captured by the radiative or nonradiative center caused by defects in the crystals. It will possibly increase the internal quantum efficiency to nearly 100% if the radiative or nonradiative center concentration caused by defects in the crystals can be inhibited to a certain degree.

Meanwhile, with an indirect transition semiconductor, free electrons and free holes exist at different symmetrical points in the crystals, and the interposition of phonons is required for recombination. It makes the recombination time roughly 3 to 6 digits longer in comparison to a direct transition semiconductor. Consequently, with an indirect transition semiconductor, it is highly likely that the free electron hole pairs will be captured by the radiative or nonradiative center caused by defects in the crystals before they are subject to direct recombination, and the internal quantum efficiency is only able to achieve a value that is much lower than 1. For the foregoing reasons, some conventional light emitting devices configured from an indirect transition semiconductor used an external emission center employing impurity atoms, and a direct transition semiconductor was primarily used in high efficiency light emitting devices. Since a diamond is also an indirect transition semiconductor, raising the internal quantum efficiency to a practical level is thought to be difficult while maintaining the advantages of 1) and 2) described above as an emission material of a wavelength in the ultraviolet range.

DISCLOSURE OF THE INVENTION

The present invention was devised in view of the foregoing circumstances. And the object of the present invention is to provide an ultraviolet light emitting device with high internal quantum efficiency equivalent to that of a direct transition semiconductor, while it is an indirect transition semiconductor.

Specifically, the present invention provides a light emitting device formed of an indirect transition semiconductor configured from a semiconductor material having high exciton binding energy, wherein an active layer of the indirect transition semiconductor or an active region by a pn junction is formed, the light emitting device has an electrode for injecting current into the active layer or the active region, and the internal quantum efficiency is 10% or more.

With the light emitting device of the present invention, the semiconductor material having high exciton binding energy is a diamond, the light emitting device comprises a p-type semiconductor layer on a substrate and an n-type semiconductor layer formed in contact with the p-type semiconductor layer, the boundary face of the p-type semiconductor layer and the n-type semiconductor layer is made to be an active region, the p-type semiconductor layer and/or the n-type semiconductor layer is configured from an indirect transition semiconductor, and the light emitting device is configured from an electrode formed in contact with the p-type semiconductor layer and the n-type semiconductor layer, respectively, or via a low resistivity layer.

Moreover, the light emitting device of the present invention may comprise a p-type semiconductor layer, an active layer configured from an indirect transition semiconductor formed in contact with the p-type semiconductor layer, and an n-type semiconductor layer formed in contact with the active layer, wherein the light emitting device may be configured from an electrode formed in contact with the p-type semiconductor layer and the n-type semiconductor layer, respectively, or via a low resistivity layer.

Further, with the light emitting device of the present invention, a p-type semiconductor layer may be formed on a substrate and an n-type semiconductor layer may be formed in contact with the p-type semiconductor layer, the boundary face of the p-type semiconductor layer and the n-type semiconductor layer may be made to be an active region, the p-type semiconductor layer and/or the n-type semiconductor layer may be configured from an indirect transition semiconductor, and the light emitting device may be configured from an electrode formed via the p-type semiconductor layer and the n-type semiconductor layer or the substrate.

Moreover, with the present invention, the substrate, the p-type semiconductor layer, and the n-type semiconductor layer may be formed from diamonds.

The present invention additionally provides a light emitting device comprising a structure in which a low resistivity layer is formed on a substrate, and a p-type semiconductor layer, an active layer configured from an indirect transition semiconductor formed in contact with the p-type semiconductor layer and an n-type semiconductor layer formed in contact with the active layer are formed on a part of the low resistivity layer, and the light emitting device is configured from an electrode formed partially in contact with the n-type semiconductor layer and the low resistivity layer.

Moreover, with the present invention, the substrate, the low resistivity layer, the p-type semiconductor layer, the active layer, and the n-type semiconductor layer may be formed from diamonds.

Further, with the present invention, the p-type semiconductor layer, the n-type semiconductor layer and the active layer may be diamonds formed with the microwave plasma CVD method.

Moreover, with the present invention, the active region or the active layer may be configured from an undoped diamond.

Further, with the present invention, the p-type semiconductor layer may be configured from a boron doped diamond, and the n-type semiconductor layer may be configured from a phosphorus doped diamond.

Moreover, with the present invention, the boron concentration and the phosphorus concentration in the undoped diamond configuring the active region or the active layer may be $1 \times 10^{15}$ cm$^{-3}$ or less.

Further, with the present invention, the film thickness of the active region or the active layer configured from the undoped diamond may be 100 nm or less.

Moreover, with the present invention, the active region or the active layer may be formed with the microwave plasma CVD method employing gas containing methane, hydrogen and oxygen atoms as the raw material gas.

Further, with the present invention, the active region or the active layer may be formed with the microwave plasma CVD method employing methane, hydrogen and oxygen as the raw material gas.

Moreover, with the present invention, the p-type semiconductor layer may be formed on a diamond single crystal (001) surface.

The present invention additionally provides a light emitting device formed of an indirect transition semiconductor configured from a semiconductor material having high exciton binding energy. This light emitting device includes a substrate, a low resistivity layer formed on the substrate, a first conductive diamond semiconductor layer formed on the low resistivity layer, an active layer formed on the first conductive diamond semiconductor layer and including a first emission exit window on a side wall face for generating an exciton with density that is greater than the density with a deeper level than the exciton and extracting its light externally, a second conductive diamond semiconductor layer formed on the active layer, wherein the second conductive diamond semiconductor layer includes a second emission exit window on the upper surface for extracting light from the active layer externally, and an electrode formed by being patterned on the second conductive diamond semiconductor layer.

The present invention additionally provides a light emitting device formed of an indirect transition semiconductor configured from a semiconductor material having high exciton binding energy. This light emitting device includes a substrate, a low resistivity layer formed on the substrate, a first conductive diamond semiconductor layer formed on the low resistivity layer, an active layer formed on the first conductive diamond semiconductor layer and including a first emission exit window provided on a side wall face for generating an exciton with density that is greater than the density with a deeper level than the exciton and extracting its light externally, and a second emission exit window provided on the upper surface, a second conductive diamond semiconductor layer formed on the active layer by being patterned onto an area that is smaller than the area of the active layer, and an electrode formed by being patterned on the second conductive diamond semiconductor layer.

With the light emitting device of the present invention, the electrode may have a mesh pattern structure with spacing of 10 μm or more that is greater than the diffusion length of the exciton in the active layer, and the ratio of the electrode area and the active layer area may be 4 or greater.

Moreover, with the light emitting device of the present invention, preferably light emitted from the active layer is deep ultraviolet light.

Further, with the light emitting device of the present invention, preferably the density of the exciton created in the active layer is $10^{17}$ to $10^{18}$/cm$^3$ or more.

The present invention is able to realize a light emitting device with high internal quantum efficiency equivalent to that of a direct transition semiconductor, while it is an indirect transition semiconductor, by utilizing the recombination of the high density excitons created in the indirect transition semiconductor crystals. This is a revolutionary invention that explodes the established theory that luminous efficiency of a practical level cannot be obtained with an indirect transition semiconductor. In addition, with the present invention, highly efficient emittance of deep ultraviolet light with a wavelength of 350 nm or less is attained. By utilizing the dispersion of excitons that is unique to indirect transition semiconductors, improving the light extraction efficiency is also attained. Accordingly, practical use in white lighting, sterilization and water purification, high density optical recording light source, various information sensing systems for fluorescence analysis and the like, medical sector, and so on can be realized.

BRIEF DESCRIPTION OF THE DRAWINGS

FIG. 1 is a view showing a frame format of the transition process of the light emitting device of the present embodiment, wherein FIG. 1A shows a case where the injected current density is small, and FIG. 1B shows a case where the injected current density is large;

Figure 1:
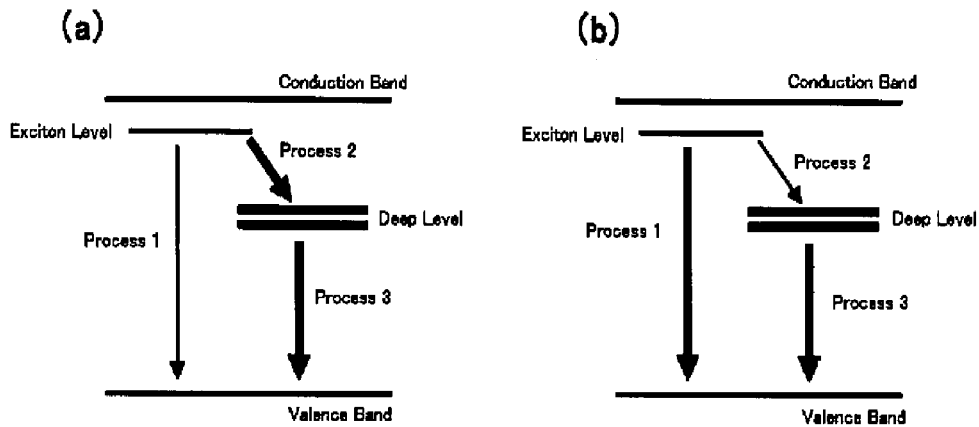

EXPLANATION OF REFERENCES 1. diamond pn junction light emitting device
2. single crystal substrate diamond having electrical conductivity
3. p-type diamond semiconductor layer
4. n-type diamond semiconductor layer
5. electrode
6. electrode
7. diamond pin junction light emitting device
8. single crystal substrate diamond
9. p$^+$-type diamond semiconductor layer
10. p-type diamond semiconductor layer
11. undoped diamond semiconductor layer
12. n-type diamond semiconductor layer
13. electrode
14. electrode

BEST MODE FOR CARRYING OUT THE INVENTION

Embodiments of the present invention are now explained in detail. Generally, the electron/hole pairs created in the semiconductor material will exist as free electrons and free holes at high temperatures, but at low temperatures, the status of spatially close electron hole pairs; namely, the status of excitons will be more stable. Excitons can exist regardless of whether the semiconductor is a direct transition semiconductor or an indirect transition semiconductor, and this is a property inherent semiconductor materials that do not depend on extrinsic components such as impurity atoms. Whether the excitons can actually exist stably is determined by the relationship of the exciton binding energy and the thermal energy that disassociates such exciton binding energy. Since excitons of conventional semiconductors have low binding energy, they can only exist at low temperatures and in low density. Meanwhile, a diamond is an indirect transition semiconductor with a broad band gap of 5.47 eV at room temperature and, as shown in Table 1 below, the free exciton binding energy is large at 80 meV in comparison to other semiconductor materials. Thus, free excitons can exist stably even under room temperature. In fact, with a high quality diamond thin film synthesized with the chemical vapor deposition (CVD) method, the carrier recombination caused by the defect level and the like is inhibited, and a free exciton emission spectrum was observed at a wavelength of 235 nm at room temperature in the measurement of the cathode luminescence and photo luminescence. In addition, as shown in Table 1, the Bohr radius of the free excitons of a diamond is small at 1.5 nm in comparison to other semiconductor materials, and, therefore, it is characterized in that excitons can be created in high density (critical exciton density (Mott density) is $6 \times 10^{19}$ cm$^{-3}$).

TABLE 1

|  | Binding Energy (meV) | Bohr Radius (nm) | Mott Density (cm$^{-3}$) |
| --- | --- | --- | --- |
| Silicon(Si) | 14.7 | 5 | $1 \times 10^{18}$ |
| Gallium Arsenide(GaAs) | 4.2 | 14 | $1 \times 10^{16}$ |
| Zinc Selenide(ZnSe) | 17 | 3.5 | $6 \times 10^{17}$ |
| Gallium Nitride(GaN) | 25 | 2.9 | $1 \times 10^{18}$ |
| Diamond(C) | 80 | 1.5 | $6 \times 10^{19}$ |

Generally, the luminous efficiency η of a light emitting device is represented with the following Formula 1. Here, $\eta_{int}$ represents the internal quantum efficiency, next represents the extraction efficiency, and $\eta_v$ represents the voltage efficiency. Among the above, $\eta_{ext}$ and $\eta_v$ are factors that depend on the manufacture process of the light emitting device, and the factor for determining the fundamental possibility of the semiconductor material or its emission mechanism is the factor of $\eta_{int}$.

$$\eta = \eta_{int}\eta_{ext}\eta_v \quad \text{[Formula 1]}$$

Moreover, the internal quantum efficiency $\eta_{int}$ is represented with the following Formula 2. Here, $\tau_r$ represents the emission lifetime of the luminescence process of interest, and $\tau_{nr}$ represents the lifetime of other transition processes (including non-luminescence process, defect-related luminescence process, etc.). In order to increase $\eta_{int}$, it is necessary to select a material in which $\tau_r$ is as small as possible in comparison to $\tau_{nr}$, or improve the technology of synthesizing materials and manufacturing devices so that $\tau_{nr}$ becomes longer.

$$\eta_{int} = \tau_r^{-1}/(\tau_r^{-1}+\tau_{nr}^{-1}) = (1+\tau_r^{-1}/\tau_{nr}^{-1})^{-1} \quad \text{[Formula 2]}$$

With a direct transition semiconductor, since the free electron hole pairs can be subject to recombination with the same symmetrical point (Gpoint) of the crystal, $\tau_r$ is short, and $\eta_{int}$ can take a large value. Meanwhile, with an indirect transition semiconductor, free electrons and free holes exist at different symmetrical points in the crystals, and the interposition of phonons is required for recombination. Thus, $\tau_r$ becomes roughly 3 to 6 digits longer in comparison to a direct transition semiconductor. Consequently, with an indirect transition semiconductor, it is highly likely that the recombination lifetime of the free electron hole pairs will be dominated by the non-luminescence process based on the defect level and the like, and $\eta_{int}$ will only attain a value that is much lower than 1. For the reasons above, it is believed that the application of an indirect transition semiconductor of Si or the like to a light emitting device is difficult.

However, since the electron hole pairs configuring the excitons are spatially close, even in the case of an indirect transition semiconductor, the probability that they will be subject to direct recombination and emit light will increase. In other words, $\tau_r$ is shortened. In fact, $\tau_r$ of a typical indirect transition semiconductor having the recombination of the free electron hole pairs as its emission mechanism is roughly 100 to 1000 μs, but with a diamond that uses the recombination from the exciton status as its emission mechanism, it was reported that $\tau_r$ is roughly 2 μs, and 2 digits shorter (A. Fujii, et. al., J. Lumin., 94-95, 355 (2001)). This is one of the reasons why a diamond has large internal quantum efficiency $\eta_{int}$ in comparison to other indirect transition semiconductors.

In addition, when creating high density excitons as in the case of a diamond, $\tau_{nr}$ can be effectively lengthened to further improve $\eta_{int}$. The present invention is now explained in further detail with reference to the attached drawings. FIG. 1 is a view showing a frame format of the transition process in which current is injected into the diamond light emitting device and enters a steady status. FIG. 1A shows a case where the injected current density is small, and FIG. 1B shows a case where the injected current density is large. The width of the arrows shown in FIG. 1 represent a frame format of the level of transition probability (wider the arrow, higher the transition probability). Most of the minority carriers (free electrons and free holes) injected into the active layer of the diamond light emitting device form excitons with more stable energy in a short period of time of 10 ps or less (M. Nagai, et. al., Phys. Rev. Lett., 68, 081202R (2003)). The formed excitons are subject to direct recombination in an emission lifetime of roughly 2 μs (process 1), or captured at a deep level due to defects and the like (process 2). The electrons or holes captured at a deep level move radiatively or non-radiatively (process 3).

A case that the injected current density of FIG. 1A is low is now considered; a case where the density of the excitons created stably in the active layer or the active region of the diamond light emitting device is lower than the deep level density caused by defects and the like. In the foregoing case, process 2 is considered to have a lifetime in an ns order that is shorter than process 1. Thus, the transition probability from excitons is more dominant in process 2 than process 1. This means that the internal quantum efficiency $\eta_{int}$ of the exciton emission is small. Next, a case that the injected current density of FIG. 1B is high is considered; that is, a case where the density of the created excitons became higher than the deep level density. If the transition lifetime of process 3 is equivalent to or longer than the direct recombination lifetime of the excitons (in fact, there are reports where the emission lifetime from the deep level is extremely long at 1.7 s in the measurement of photoluminescence (K. Horiuchi, et. al., Jpn. J. Appl. Phys., 36, L1505 (1997))), the deep level realizes a status filled with electrons or holes that were configuring the excitons. This status means that the transition of process 2 was effectively saturated; that is, the transition lifetime of process 2 lengthened to a great extent. If the transition of process 2 is effectively saturated, all excitons will go through the luminescence process of process 1. Thus, the internal quantum efficiency $\eta_{int}$ of the exciton emission should become a value comparable to the internal quantum efficiency (tens of percent) of a direct transition semiconductor even though it is an indirect transition semiconductor. As described above, in principle, $\tau_{nr}$ can be effectively lengthened and the internal quantum efficiency $\eta_{int}$ from the exciton emission can be increased to tens of percent by utilizing the high density exciton status unique to diamonds.

Examples of the present invention are now explained in further detail with reference to the foregoing embodiments.

Example 1

Figure 2:
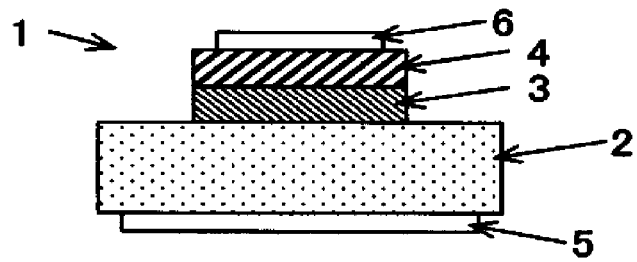
FIG. 2 is a cross section of the light emitting device configuration of Example 1.

FIG. 2 is a cross section of a diamond pn junction light emitting device 1 applying a diamond as the indirect transition semiconductor as Example 1 of the present invention. In FIG. 2, a p-type diamond semiconductor layer 3 added with boron (B) was synthesized by microwave plasma CVD in a film thickness of 1 μm on the (001) surface of the high pressure synthesized single crystal substrate diamond 2 having electrical conductivity, and an n-type diamond semiconductor layer 4 added with phosphorus (P) was additionally synthesized thereon by microwave plasma CVD in a film thickness of 1 μm to form a pn junction. The synthesized conditions of the respective layers by microwave plasma CVD are collectively shown in Table 2. In the synthesis of the p-type diamond semiconductor layer 3, the diborane ($B_2H_6$) remaining in the vacuum vessel for performing microwave plasma CVD was used as the impurity gas. The B concentration of the p-type diamond semiconductor layer 3 was 2 to $4 \times 10^{16}$ cm$^{-3}$, and the P concentration of the n-type diamond semiconductor layer 4 was 2 to $5 \times 10^{18}$ cm$^{-3}$. This laminated film was subject to dry-etching to form mesa in a cylindrical shape of a diameter of 240 μm, the surface was subject to chemical oxidation treatment, and, based on electron beam evaporation, metal electrodes 5, 6 were respectively formed on the back face of the high pressure synthesized single crystal substrate diamond 2 having electrical conductivity and on the surface of the n-type diamond semiconductor layer 4. The diameter of the metal electrode 6 was 200 μm.

TABLE 2

| | p type semiconductor Layer | n type Semiconductor Layer |
|---|---|---|
| Material Gas | Methane($CH_4$) Hydrogen($H_2$) Diborane($B_2H_6$) | Methane($CH_4$) Hydrogen($H_2$) Phosphin($PH_3$) |
| Temperature of Substrate | 800° C. | 900° C. |
| Methane Density Ratio | ($CH_4/H_2$) 0.2% | ($CH_4/H_2$) 0.4% |
| Impurity Gas Density Ratio | ($B_2H_6/CH_4$) 0% | ($PH_3/CH_4$) 5.0% |
| Material Gas Pressure | 25 Torr | 25 Torr |
| Microwave Power | 750 W | 750 W |

Figure 3:
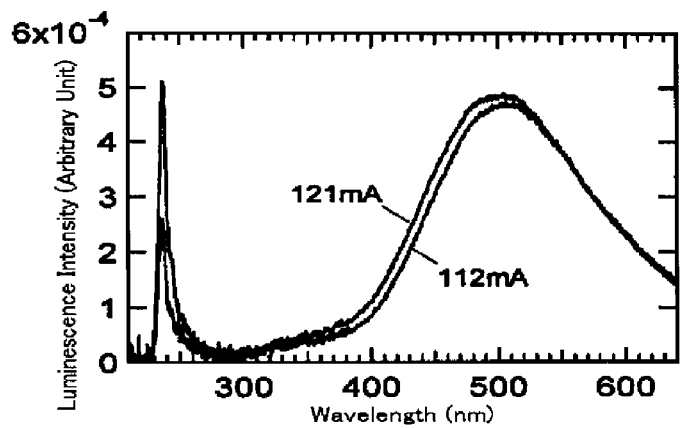
FIG. 3 is a diagram of the luminescence of property of Example 1.

FIG. 3 shows the luminescence property upon injecting, at room temperature, forward direction current into the diamond light emitting device 1 as Example 1 of the present invention. When the applied voltages are 69V, 71V, the injected currents are respectively 112 mA, 121 mA. It is evident that brilliant emission based on the direct recombination of free excitons is observed in the vicinity of the wavelength of 235 nm even at room temperature. In this emission spectrum, a broad emission from a deep level caused by defects and the like is also observed in the vicinity of the wavelength of 500 nm as the peak.

Figure 4:
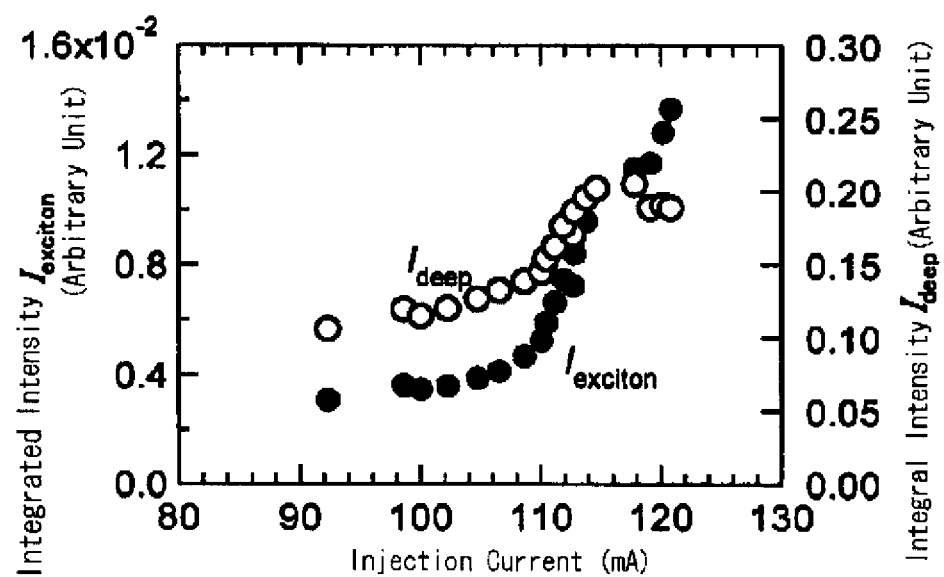
FIG. 4 is a diagram of the injected current dependency of the luminous integrated intensity of Example 1.

FIG. 4 shows the injected current dependency of the integrated intensity $I_{exciton}$ of the emission based on the direct recombination of free excitons and the integrated intensity $I_{deep}$ of the broad emission from the deep level caused by defects and the like. With the increase in the injected current, $I_{deep}$ is saturating, while $I_{exciton}$ increases nonlinearly. As observed with reference to FIG. 1 in the embodiments of the present invention, this can be explained by interpreting that the transition of process 2 was effectively saturated; namely, the transition lifetime of process 2 was lengthened to a great extent. And since all excitons will go through the luminescence process of process 1, $I_{exciton}$ will increase nonlinearly, and internal quantum efficiency $\eta_{int}$ of the exciton emission will also increase nonlinearly. As a result of measuring the capacity-voltage of the diamond light emitting device 1 as Example 1 of the present invention, it was found that electrically active defects with a density of at least roughly $10^{17}$ $cm^{-3}$ exist in the vicinity of the pn junction boundary face.

Accordingly, the result of FIG. 4 is explained by that excitons having a density of at least $10^{17}$ to $10^{18}$ $cm^{-3}$ or greater are created in the active region of the diamond light emitting device 1 by current injection. This exciton density is not possible with other semiconductor materials other than a diamond.

Moreover, even at a high temperature of roughly 200° C., brilliant emission based on the direct recombination of free excitons was observed, and the saturation of $I_{deep}$ and the nonlinear increase of $I_{exciton}$ with the increase in the injected current as shown in FIG. 4 were observed.

Example 2

Figure 5:
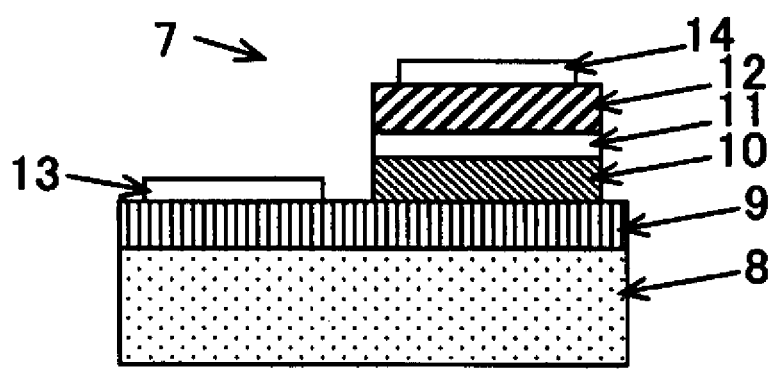
FIG. 5 is a cross section of the light emitting device configuration of Example 2.

FIG. 5 is a cross section of a diamond pin junction light emitting device 7 applying a diamond as the indirect transition semiconductor as Example 2 of the present invention. In FIG. 5, a p$^+$-type diamond semiconductor layer 9 added with boron (B) was synthesized by microwave plasma CVD in a film thickness of 1 μm on the (001) surface of the high pressure synthesized single crystal substrate diamond 8, a p-type diamond semiconductor layer 10 added with B was additionally synthesized thereon by microwave plasma CVD in a film thickness of 1.3 μm, an undoped diamond semiconductor layer 11 as the active layer was additionally synthesized thereon by microwave plasma CVD in a film thickness of 0.1 μm, and an n-type diamond semiconductor layer 12 added with phosphorus (P) was additionally synthesized thereon by microwave plasma CVD in a film thickness of 0.7 μm to form a pin junction. The synthesized conditions of the respective layers by microwave plasma CVD are collectively shown in Table 3. In the synthesis of the undoped diamond semiconductor layer 11, mixture of impurity elements into the synthesized film is prevented by mixing oxygen in the synthetic gas. Here, in substitute for oxygen gas, gas containing oxygen atoms (O) such as carbon monoxide (CO), carbon dioxide ($CO_2$), ozone ($O_3$), water ($H_2O$), may be used.

Figure 6:
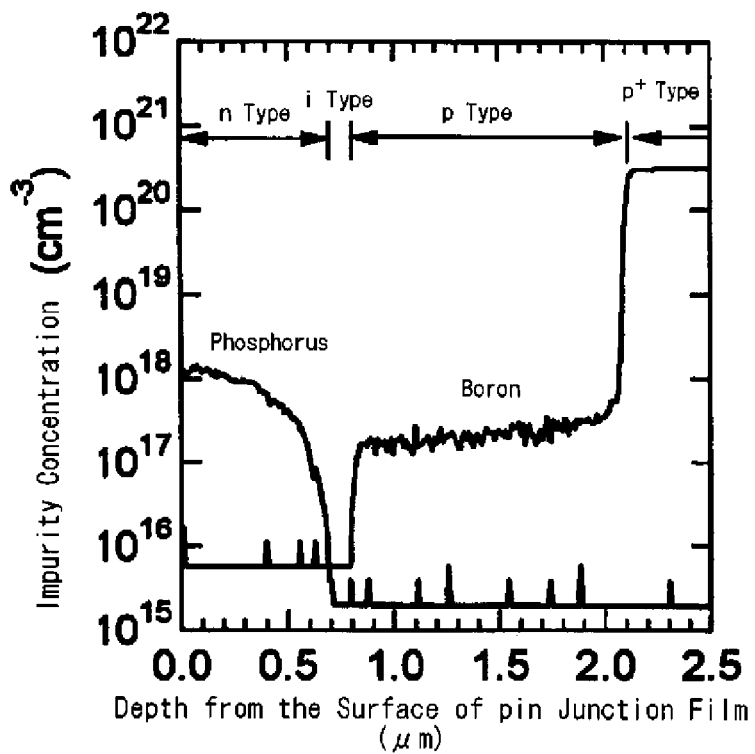
FIG. 6 is a diagram of the depth direction distribution of the pin junction impurity concentration of Example 2.

Moreover, in the synthesis of the p-type semiconductor layer 10, the diborane ($B_2H_6$) remaining in the vacuum vessel for performing microwave plasma CVD was used as the impurity gas. FIG. 6 shows the results of estimation by secondary ion mass spectrometry of the depth direction distribution of the impurity concentration in the respective layers of p$^+$-type, p-type, i-type, and n-type. The B concentration of the p$^+$-type diamond semiconductor layer 9 was $3 \times 10^{20}$ $cm^{-3}$, the B concentration of the p-type diamond semiconductor layer 10 was $2 \times 10^{17}$ $cm^{-3}$, and the P concentration of the n-type diamond semiconductor layer 12 was $1 \times 10^{18}$ $cm^{-3}$. The undoped diamond semiconductor layer 11 as the active layer had no dispersion of B as the impurity element in the p-type diamond semiconductor layer 10 or the dispersion of P as the impurity element in the n-type diamond semiconductor layer 12, and, as shown in FIG. 6, the impurity concentration was lower than the detection limit based on secondary ion mass spectrometry (SIMS), and the film was formed accurately 100 nm in thickness.

As a result of measuring the impurity concentration in the undoped diamond semiconductor layer 11 based on a higher resolution SIMS method, the B concentration was inhibited to be $6 \times 10^{14}$ $cm^{-3}$ or less, and the P concentration was inhibited to be $1 \times 10^{15}$ $cm^{-3}$ or less. This laminated film was subject to dry-etching to form mesa up to the p$^+$-type diamond semiconductor layer 9 in a cylindrical shape having a diameter of 220 μm, the surface was subject to chemical oxidation treatment, and, based on electron beam evaporation, 30 nm of titanium was deposited on an area that does not come in contact with the mesa structure on the surface of the p$^+$-type diamond semiconductor layer 9, and on the surface of the n-type diamond semiconductor layer 12, respectively, 300 nm of platinum (Pt) was subsequently deposited, and heat treatment was performed at 420° C. for 30 minutes in order to form the metal electrodes 13, 14. The diameter of the metal electrode 14 formed on the surface of the n-type diamond semiconductor layer 12 was 200 μm.

TABLE 3

| | p+ type semiconductor Layer | p type semiconductor Layer | i type semiconductor Layer | n type Semiconductor Layer |
|---|---|---|---|---|
| Material Gas | Methane($CH_4$) Hydrogen($H_2$) Diborane($B_2H_6$) | Methane($CH_4$) Hydrogen($H_2$) Diborane($B_2H_6$) | Methane($CH_4$) Hydrogen($H_2$) Oxygen($O_2$) | Methane($CH_4$) Hydrogen($H_2$) Phosphin($PH_3$) |
| Temperature of Substrate | 800-900° C. | 800-900° C. | 800-900° C. | 900° C. |
| Methane Density Ratio | ($CH_4/H_2$) 0.6% | ($CH_4/H_2$) 0.6% | ($CH_4/H_2$) 0.6% | ($CH_4/H_2$) 0.4% |
| Impurity Gas Density Ratio | ($B_2H_6/CH_4$) 0.8% | ($B_2H_6/CH_4$) 0% | ($O_2/CH_4$) 41.7% | ($PH_3/CH_4$) 5.0% |
| Material Gas Pressure | 50 Torr | 50 Torr | 50 Torr | 25 Torr |
| Microwave Power | 1200 W | 1200 W | 1200 W | 750 W |

Figure 7:
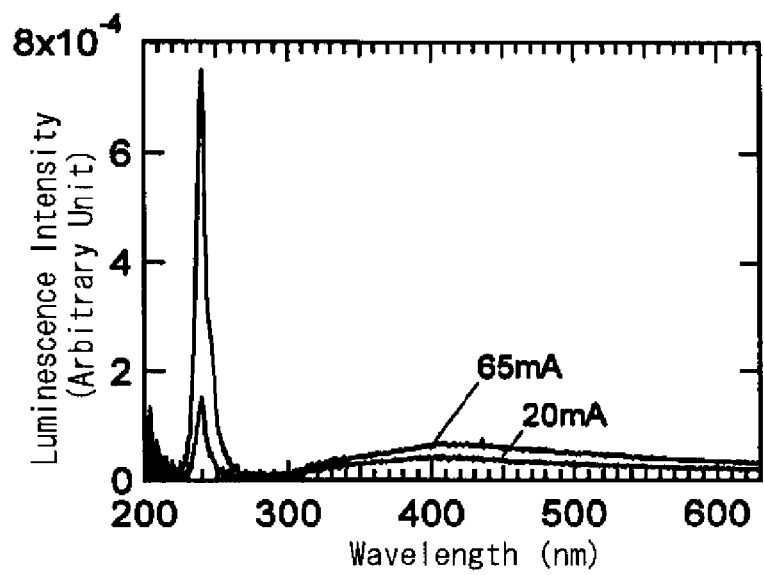
FIG. 7 is a diagram of the luminescence property of Example 2.

FIG. 7 shows the luminescence property upon injecting, at room temperature, forward direction current into the diamond light emitting device 7 as Example 2 of the present invention. When the applied voltages are 24V, 28V, the injected currents are respectively 20 mA, 65 mA. Similar to the results of Example 1, it is evident that brilliant emission based on the direct recombination of free excitons is observed in the vicinity of the wavelength of 235 nm even at room temperature. Meanwhile, the broad emission from the deep level caused by defects and the like with the vicinity of the wavelength of 400 nm as the peak was inhibited to 1/10 or less of the peak strength of the free exciton emission. This point differs significantly from the results of Example 1.

Figure 8:
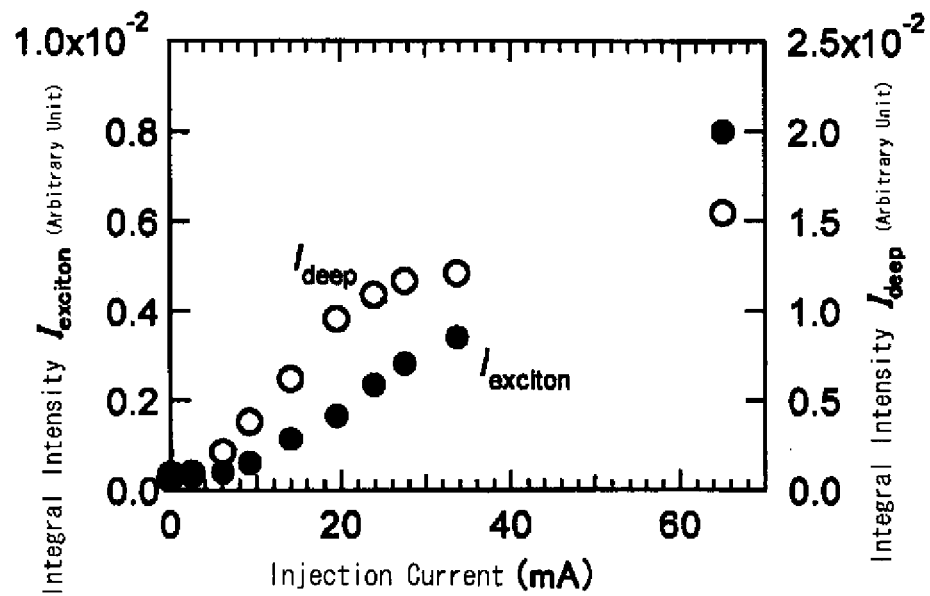
FIG. 8 is a diagram of the injected current dependency of the luminous integrated intensity of Example 2.

FIG. 8 shows the injected current dependency of the integrated intensity $I_{exciton}$ of the emission based on the direct recombination of free excitons and the integrated intensity $I_{deep}$ of the broad emission from the deep level caused by defects and the like. With the increase in the injected current, $I_{deep}$ is of a saturating trend while $I_{exciton}$ increases monotonously. The current value where the saturation tendency of $I_{deep}$ starts to appear was 110 mA or more in Example 1, but this is roughly 25 mA and much smaller in Example 2. This means that the saturation of transition of process 2 shown in FIG. 1 is occurring at a lower current. As described above, in comparison to Example 1, Example 2 shows considerable improvement in the free exciton luminescence property. This means that, in the diamond light emitting device 7 as Example 2 of the present invention, the undoped diamond semiconductor layer 11 (active layer) in which the deep level density caused by defects and the like was kept low functioned effectively in the creation, accumulation and direct recombination of the free excitons.

As shown in Formula (1) above, in order to improve the luminous efficiency η of the light emitting device, improvement of the light extraction efficiency $\eta_{ext}$ is also an important parameter. For improvement of the light extraction efficiency $\eta_{ext}$, it is necessary to extract light outside the light emitting device efficiently by reducing the rate of the light generated in the active layer of the light emitting device from being absorbed by the crystal defects or impurity level in the light emitting device, or being reflected with or absorbed by the metal to be used in the electrodes.

With the diamond pn junction light emitting device 1 as Example 1 of the present invention shown in FIG. 2, the mesa structure diameter was 240 μm, and the diameter of the metal electrode 6 formed on the surface of the n-type diamond semiconductor layer 4 was 200 μm. In the foregoing case, a part of the emission by the direction recombination of free excitons generated by injecting forward direction current into the diamond pn junction light emitting device 1 can be extracted from the side wall of the mesa structure. However, most of the light will be self-absorbed by the metal electrode 6, and cannot be extracted outside the light emitting device.

With the diamond pin junction light emitting device 7 as Example 2 of the present invention shown in FIG. 5, the mesa structure diameter was 220 μm, and the diameter of the metal electrode 14 formed on the surface of the n-type diamond semiconductor layer 12 was 200 μm. By injecting the forward direction current into the diamond pin junction light emitting device 7, the free excitons are created in the undoped diamond semiconductor layer 11 positioned below the metal electrode 14. In the foregoing case, a part of the emission by the direct recombination of the created free excitons can be extracted not only in the lateral direction from an area exposing the undoped diamond semiconductor layer of the side wall of the mesa structure, but also in the upper direction from the n-type diamond semiconductor layer 12 in the periphery of the metal electrode 14 at the upper part of the mesa structure. This can be realized by utilizing the dispersion of excitons as described below.

As shown in Formula 2 indicated above, in a high quality undoped diamond in which the density of defects and impurities is kept low, the lifetime τ of the free excitons will hardly be affected by the lifetime $\tau_{nr}$ of the transition process other than direct recombination, and will become nearly equal to the lifetime $\tau_r$ by direct recombination. The direct recombination lifetime $\tau_r$ of the free excitons of a diamond is roughly 2 μs (A. Fujii, et. al., J. Lumin., 94-95, 355 (2001)), and is shorter by nearly 2 digits in comparison to other indirect transition semiconductors, but longer by 3 digits or more in comparison to that of a direct transition semiconductor. As described above, if the free excitons have a lifetime of a micro second order, the dispersion of free excitons can be expected. In fact, Teraji et. al. have experimentally confirmed that carriers or excitons are dispersed in a high quality diamond film in the range of at least roughly 10 μm (T. Teraji, et. al., J. Appl. Phys., 96, 7300, (2004)). With the diamond pin junction light emitting device 7 as Example 2 of the present invention shown in FIG. 5, the free excitons created in the undoped diamond semiconductor layer 11 positioned under the metal electrode 14 can be dispersed in the periphery of the metal electrode 14 in the lateral direction in the high quality undoped diamond semiconductor layer 11. The emission of the deep ultraviolet region by the direction recombination from the free excitons dispersed in the periphery of the metal electrode 14 in the undoped diamond semiconductor layer 11 can be extracted in the upper direction outside of the diamond pin junction light emitting device 7 without being reflected on or absorbed by the metal electrode 14.

Example 3

Figure 9:
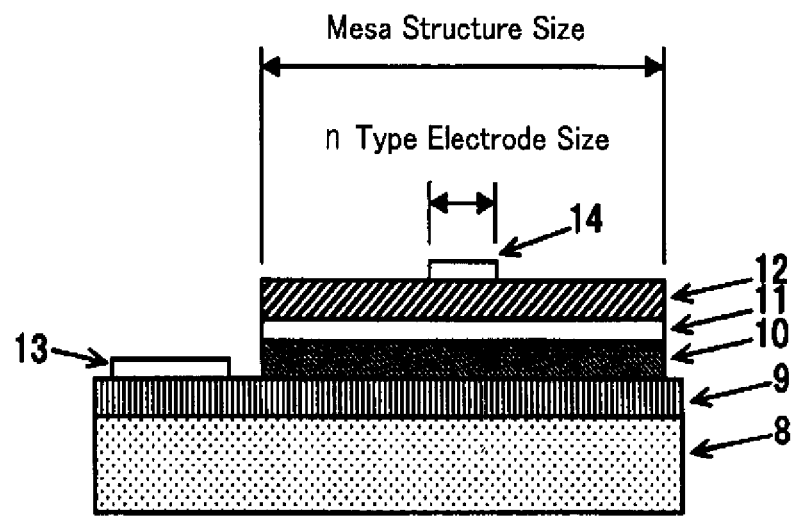
FIG. 9 is a cross section of the light emitting device of Example 3 illustrating the configuration of a light emitting device in which the diameter of the electrode on the n-type diamond semiconductor layer in the light emitting device of Example 2 is 50 μm.
Figure 10:
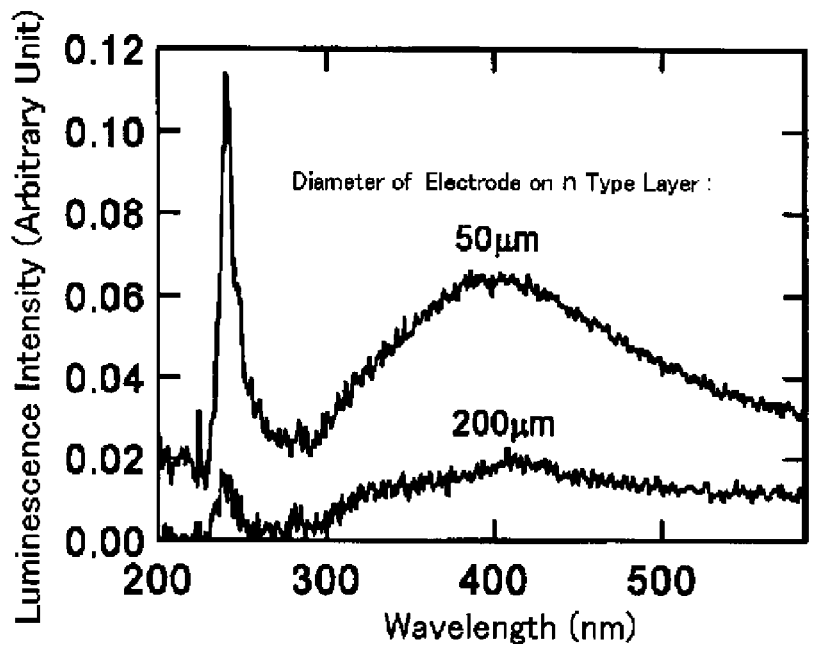
FIG. 10 is a diagram of the luminescence property of the light emitting devices illustrated in FIG. 5 and FIG. 9.

FIG. 9 shows a diamond pin junction light emitting device in which the diameter of the metal electrode 14 formed on the surface of the n-type diamond semiconductor layer 12 was reduced to 50 μm in the diamond pin junction light emitting device 7 as Example 2 of the present invention shown in FIG. 5. Moreover, FIG. 10 shows the luminescence property in the case of flowing current of 12 mA in the forward direction in the diamond pin junction light emitting device shown in FIG. 9. As a comparison, FIG. 10 also shows the luminescence property in the case of flowing current of 12 mA in the forward direction in the diamond pin junction light emitting device 7 shown in FIG. 5 in which the diameter of the metal electrode 14 is 200 μm. The strength of the brilliant emission peak by the direction recombination of free excitons that can be seen in the vicinity of the wavelength of 240 nm was increased roughly six-fold by reducing the diameter of the metal electrode 14 from 200 μm to 50 μm. Assuming that the number of free excitons formed in the active layer of the diamond pin junction light emitting device is proportionate to the injected current value, this means that the light extraction efficiency $\eta_{ext}$ has increased roughly six-fold by reducing the diameter of the metal electrode 14. The improvement of this light extraction efficiency reflects the increase in the light intensity of the light that can be extracted in the upper direction from the periphery of the metal electrode 14 by utilizing the dispersion of free excitons. As described above, by utilizing the dispersion of free excitons unique to indirect transition semiconductors, deep ultraviolet light can be efficiently extracted from the diamond pin junction by the direct recombination of free excitons.

Example 4

Figure 11:
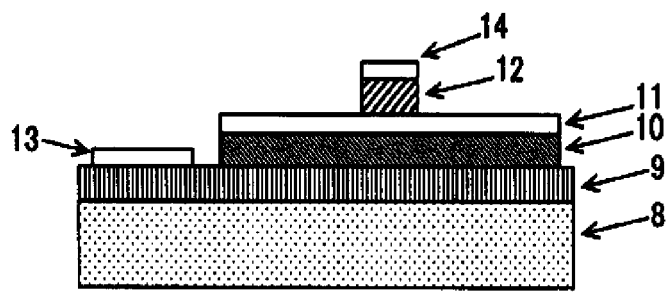
FIG. 11 is a cross section of the light emitting device of Example 4 illustrating the configuration of a light emitting device in which the n-type diamond semiconductor layer was left only on an area where an electrode was formed on the n-type diamond semiconductor layer and in which the n-type diamond semiconductor layer of the other areas was removed in the light emitting device illustrated in FIG. 9.

In order to increase the strength of the deep ultraviolet light that can be extracted in the upper direction from the periphery of the metal electrode 14 in the diamond pin junction light emitting device shown in FIG. 9, it is also possible to leave the n-type diamond semiconductor layer 12 just beneath the metal electrode 14 and eliminate the n-type diamond semiconductor layer 12 in the other areas by dry etching or the like as shown in FIG. 11. Consequently, emission from the free excitons dispersed in the periphery of the metal electrode 14 can be directly extracted in the upper direction without going through the n-type diamond semiconductor layer 12. Accordingly, it is possible to further improve the extraction efficiency of deep ultraviolet light by eliminating the absorption of the deep ultraviolet light by the defects or impurity level in the n-type diamond semiconductor layer 12.

Figure 12:
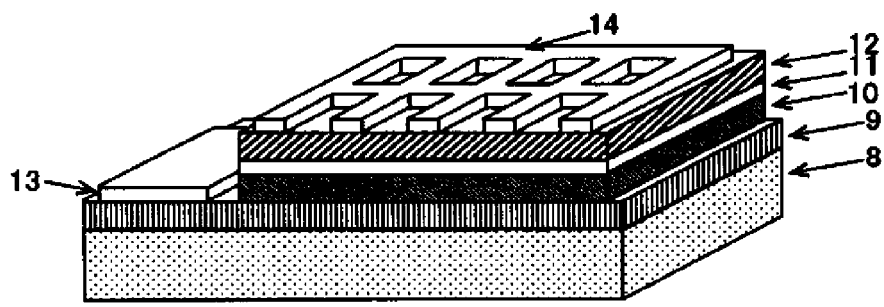
FIG. 12 is a diagram illustrating the configuration of a light emitting device in which the shape of the electrode on the n-type diamond semiconductor layer is a mesh pattern structure in the light emitting device illustrated in FIG. 5.

Moreover, in order to increase the strength of the deep ultraviolet light that can be extracted in the upper direction from the periphery of the metal electrode 14 in the diamond pin junction light emitting device shown in FIG. 9, it is also possible to make the shape of the metal electrode 14 formed on the surface of the n-type diamond semiconductor layer 12 of the diamond pin junction light emitting device into a mesh pattern structure with spacing that is greater than the diffusion length (10 μm) of the free excitons or carriers as shown in FIG. 12.

Figure 13:
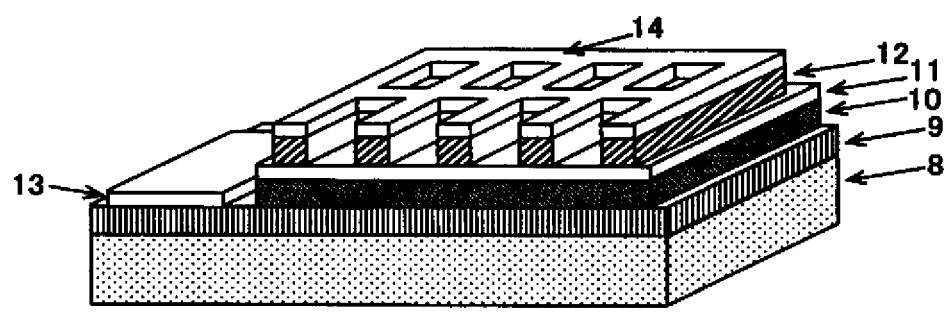
FIG. 13 is a diagram illustrating the configuration of a light emitting device in which the n-type diamond semiconductor layer was left only on an area where an electrode was formed on the n-type diamond semiconductor layer and in which the n-type diamond semiconductor layer of the other areas was removed in the light emitting device illustrated in FIG. 12.

In addition, as shown in FIG. 13, it is also possible to leave the n-type diamond semiconductor layer 12 only in an area where the metal electrode 14 is formed in FIG. 12 and eliminate the n-type diamond semiconductor layer 12 in the other areas by dry etching or the like.

INDUSTRIAL APPLICABILITY

As described above, the present invention is able to realize a deep ultraviolet light emitting device with a wavelength of 250 nm or less having high internal quantum efficiency equivalent to that of a direct transition semiconductor, while it is an indirect transition semiconductor, based on the unique material physicality of a diamond (luminescence process via the exciton, high density exciton status) and by forming a pin junction structure in order to maximize such material physicality, even under harsh environments at room temperature or higher. Moreover, it is possible to realize a deep ultraviolet light emitting device with a wavelength of 250 nm or less and having high light extraction efficiency by utilizing the dispersion of excitons. As a result of realizing such a deep ultraviolet light emitting device, widespread practical use in white lighting, sterilization and water purification, high density optical recording light source, various information sensing systems for fluorescence analysis and the like, medical sector, and so on can be realized.

The invention claimed is:

1. A light emitting device formed of an indirect transition semiconductor configured from a semiconductor material having high exciton binding energy, wherein the semiconductor material having high exciton binding energy is a diamond in which recombination of free electron and hole pairs provides its light emission mechanism, wherein the semiconductor material includes at least four different diamond layers including a low-resistivity layer, a p-type semiconductor layer, an i-type semiconductor layer, and an n-type semiconductor layer, wherein the low-resistivity layer is formed by a p+-type semiconductor layer, and wherein an active layer of the indirect transition semiconductor is formed by the i-type semiconductor layer, the light emitting device has an electrode for injecting current into the active layer, and internal quantum efficiency is 10% or more.

2. The light emitting device according to claim 1, wherein the active layer is formed in contact with the p-type semiconductor layer and the n-type semiconductor layer; and wherein the electrode includes two separate electrodes, at least one of the two electrodes being formed in contact with the low resistivity layer which is in contact with a face of the p-type semiconductor layer that is free from contact with the active layer.

3. The light emitting device according to claim 2, wherein the active layer is formed with the microwave plasma CVD method employing gas containing methane, hydrogen and oxygen atoms as the raw material gas.

4. The light emitting device according to claim 2, wherein the active layer is formed with the microwave plasma CVD method employing methane, hydrogen and oxygen as the raw material gas.

5. The light emitting device according to claim 2, wherein the semiconductor material includes a fifth different diamond layer, the fifth different diamond layer being a low-resistivity layer formed by a n+-type semiconductor layer, and wherein at least one of the two electrodes is formed in contact with the low resistivity layer formed by the n+-type semiconductor layer which is in contact with a face of the n-type semiconductor layer that is free from contact with the active layer.

6. The light emitting device according to claim 1, wherein the p-type semiconductor layer is formed on a diamond single crystal (001) surface.

7. A light emitting device comprising a structure in which a low resistivity layer is formed on a substrate, and a p-type semiconductor layer, an active layer configured from an indirect transition semiconductor formed in contact with the p-type semiconductor layer and an n-type semiconductor layer formed in contact with the active layer are formed on a part of the low resistivity layer, and the light emitting device is configured from an electrode formed partially in contact with the low resistivity layer, wherein the substrate, the low resistivity layer, the p-type semiconductor layer, the active layer, and the n-type semiconductor layer are diamond, and wherein the low resistivity layer is a p+-type semiconductor layer and the active layer is an i-type semiconductor layer.

8. The light emitting device according to claim 7, wherein the p+-type semiconductor layer, the p-type semiconductor layer, the n-type semiconductor layer and the active layer are diamond formed with the microwave plasma CVD method.

9. The light emitting device according to claim 7, wherein the active layer is configured from an undoped diamond.

10. The light emitting device according to claim 9, wherein the p+-type semiconductor layer and the p-type semiconductor layer are configured from a boron doped diamond, and the n-type semiconductor layer is configured from a phosphorus doped diamond.

11. The light emitting device according to claim 10, wherein the boron concentration and the phosphorus concentration in the undoped diamond configuring the active layer is $1 \times 10^{15}$ cm$^{-3}$ or less.

12. The light emitting device according to claim 11, wherein the film thickness of the active layer configured from the undoped diamond is 100 nm or less.

13. A light emitting device according to claim 7, further comprising a second low resistivity layer which is formed on the n-type semiconductor layer, and a second electrode in contact with the second low resistivity layer.

14. A light emitting device formed of an indirect transition semiconductor configured from a semiconductor material having high exciton binding energy, comprising:
a substrate;
a low resistivity layer of a p+-type diamond semiconductor formed on the substrate;
a first conductive p-type diamond semiconductor layer formed on the low resistivity layer;
an active layer of an i-type diamond semiconductor formed on the first conductive p-type diamond semiconductor layer and generating excitons with a density that is greater than a density of crystal defects having levels deeper than that of the excitons, the active layer including a first emission exit window on a side wall face through which light is extracted and emitted outwardly;
a second conductive n-type diamond semiconductor layer formed on the active layer, wherein the second conductive n-type diamond semiconductor layer includes a second emission exit window on an upper surface for extracting light from the active layer externally; and
an electrode formed by being patterned on the second conductive n-type diamond semiconductor layer.

15. The light emitting device according to claim 14, wherein the electrode comprises a mesh pattern structure with spacing of 10 μm or more that is greater than the diffusion length of the exciton in the active layer.

16. The light emitting device according to claim 14, wherein an area of a face of the active layer to an area of a face of the electrode patterned on the second conductive n-type diamond semiconductor layer has a ratio of 4 or greater.

17. The light emitting device according to claim 14, wherein light emitted from the active layer is deep ultraviolet light.

18. The light emitting device according to claim 14, wherein the density of the exciton created in the active layer is $10^{17}$ to $10^{18}/cm^3$ or more.

19. The light emitting device according to claim 14, wherein the second conductive n-type diamond semiconductor layer is formed on the active layer by being patterned onto an area that is smaller than the area of the active layer.

* * * * *

UNITED STATES PATENT AND TRADEMARK OFFICE
CERTIFICATE OF CORRECTION

PATENT NO. : 8,592,824 B2  Page 1 of 1
APPLICATION NO. : 12/438396
DATED : November 26, 2013
INVENTOR(S) : Satoshi Yamasaki et al.

It is certified that error appears in the above-identified patent and that said Letters Patent is hereby corrected as shown below:

In the Specification

Column 5, line 63 "inherent semiconductor" should read "inherent to semiconductor"

Signed and Sealed this
Fourth Day of March, 2014

Michelle K. Lee
*Deputy Director of the United States Patent and Trademark Office*